United States Patent
Iwase et al.

(10) Patent No.: US 11,532,484 B2
(45) Date of Patent: Dec. 20, 2022

(54) PLASMA PROCESSING APPARATUS AND PLASMA PROCESSING METHOD

(71) Applicant: HITACHI HIGH-TECH CORPORATION, Tokyo (JP)

(72) Inventors: Taku Iwase, Tokyo (JP); Takao Arase, Tokyo (JP); Satoshi Terakura, Tokyo (JP); Hayato Watanabe, Tokyo (JP); Masahito Mori, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/482,106

(22) PCT Filed: Oct. 26, 2018

(86) PCT No.: PCT/JP2018/039866
§ 371 (c)(1),
(2) Date: Jul. 30, 2019

(87) PCT Pub. No.: WO2019/138654
PCT Pub. Date: Jul. 18, 2019

(65) Prior Publication Data
US 2020/0227270 A1    Jul. 16, 2020

(51) Int. Cl.
*H01L 21/3213* (2006.01)
*H01L 21/311* (2006.01)
(Continued)

(52) U.S. Cl.
CPC .. *H01L 21/31116* (2013.01); *H01L 21/32137* (2013.01); *H01L 27/11556* (2013.01); *H01L 27/11582* (2013.01)

(58) Field of Classification Search
CPC .......... H01L 21/3065; H01L 21/31116; H01L 21/32137; H01L 27/11556;
(Continued)

(56) References Cited

U.S. PATENT DOCUMENTS

| 5,112,435 A | 5/1992 | Wang et al. |
| 6,063,710 A | 5/2000 | Kadomura et al. |

(Continued)

FOREIGN PATENT DOCUMENTS

| JP | S62176134 A | 8/1987 |
| JP | H09298192 A | 11/1997 |

(Continued)

OTHER PUBLICATIONS

International Search Report for PCT/JP2018/039866, dated Dec. 18, 2018.

(Continued)

*Primary Examiner* — Lan Vinh
(74) *Attorney, Agent, or Firm* — Miles & Stockbridge, P.C.

(57) ABSTRACT

In order to implement a plasma etching method for improving a tapered shape, a plasma processing apparatus includes: a processing chamber in which a sample is subjected to plasma processing; a first radio frequency power source that supplies radio frequency power for generating a plasma; a sample stage on which the sample is placed; a second radio frequency power source that supplies radio frequency power to the sample stage; and a control unit that controls the first radio frequency power source and the second radio frequency power source so as to etch a stacked film formed by alternately stacking a silicon oxide film and a polycrystalline silicon, or a stacked film formed by alternately stacking a silicon oxide film and a silicon nitride film, by using a plasma generated by a mixed gas of a hydrogen bromide gas, a hydrofluorocarbon gas and a nitrogen element-containing gas.

4 Claims, 8 Drawing Sheets

(51) Int. Cl.
*H01L 27/11556* (2017.01)
*H01L 27/11582* (2017.01)

(58) Field of Classification Search
CPC ......... H01L 27/11582; H01L 21/32136; H01L 21/67069; H01L 21/67248; H01J 37/32724
USPC ....... 438/700, 706, 710, 712, 714, 717, 719, 438/723, 736, 750
See application file for complete search history.

(56) References Cited

U.S. PATENT DOCUMENTS

| | | | |
|---|---|---|---|
| 9,230,824 B2* | 1/2016 | Takayama | H01L 21/31144 |
| 9,337,056 B2* | 5/2016 | Takahashi | H01L 21/32137 |
| 2002/0125207 A1 | 9/2002 | Ono et al. | |
| 2005/0023592 A1 | 2/2005 | Sasaki et al. | |
| 2006/0011580 A1* | 1/2006 | Shimizu | H01L 21/67167 |
| | | | 216/67 |
| 2011/0223769 A1 | 9/2011 | Ko et al. | |
| 2013/0157427 A1 | 6/2013 | Cho et al. | |
| 2013/0244394 A1 | 9/2013 | Kim et al. | |
| 2014/0057442 A1 | 2/2014 | Lee et al. | |
| 2014/0299571 A1 | 10/2014 | Sawataishi | |
| 2015/0004795 A1 | 1/2015 | Ishii | |
| 2015/0179466 A1 | 6/2015 | Takayama et al. | |
| 2015/0221518 A1 | 8/2015 | Terakura et al. | |
| 2015/0228500 A1* | 8/2015 | Ogawa | H01J 37/32091 |
| | | | 438/715 |
| 2015/0332932 A1* | 11/2015 | Hirotsu | H01L 21/311 |
| | | | 438/723 |
| 2016/0042918 A1* | 2/2016 | Saitoh | H01L 21/31116 |
| | | | 216/67 |
| 2018/0204728 A1* | 7/2018 | Oomori | H01L 21/31 |
| 2018/0226264 A1 | 8/2018 | Takayama et al. | |
| 2019/0043732 A1 | 2/2019 | Eason et al. | |
| 2019/0131125 A1 | 5/2019 | Yamaguchi | |
| 2021/0082709 A1 | 3/2021 | Tomura et al. | |

FOREIGN PATENT DOCUMENTS

| | | | |
|---|---|---|---|
| JP | H11297679 A | 10/1999 | |
| JP | 2001085395 A | 3/2001 | |
| JP | 2005-050917 A | 2/2005 | |
| JP | 2005203612 A | 7/2005 | |
| JP | 2011192776 A | 9/2011 | |
| JP | 2014203912 A | 10/2014 | |
| JP | 2015012178 A | 1/2015 | |
| JP | 2015119099 A | 6/2015 | |
| JP | 2015144158 A | 8/2015 | |
| JP | 2016039309 A | 3/2016 | |
| JP | 2017050529 A | 3/2017 | |
| JP | 2017103388 A | 6/2017 | |
| JP | 201908000 A | 1/2019 | |
| TW | 201331343 A | 8/2013 | |
| TW | 201921484 A | 6/2019 | |
| TW | 202004908 A | 1/2020 | |

OTHER PUBLICATIONS

Search Report dated Jan. 26, 2021 in International Application No. PCT/JP2020/048095.
Written Opinion dated Jan. 26, 2021 in International Application No. PCT/JP2020/048095.
Response Written Opinion filed May 12, 2021 in International Application No. PCT/JP2020/048095.
Office Action dated Jun. 4, 2021 in Taiwanese Application No. 10106613.

* cited by examiner

PLASMA PROCESSING APPARATUS AND PLASMA PROCESSING METHOD

TECHNICAL FIELD

The present invention relates to a plasma processing apparatus and a plasma processing method, and particularly relates to a plasma processing apparatus and a plasma processing method that perform etching processing and that are suitable for processing deep holes or deep trenches having high aspect ratio.

BACKGROUND ART

Semiconductor devices having a three-dimensional structure are manufactured and miniaturization and multi-layering of patterns to be formed are in progress.

For example, in a NAND flash memory device having a three-dimensional structure, it is necessary to form a via or a trench that penetrates a stacked film formed by stacking a number of pairs of polycrystalline silicon (poly-Si) films and silicon oxide ($SiO_2$) films, or by stacking a number of pairs of silicon nitride (SiN) films and silicon oxide ($SiO_2$) films.

PTL 1 discloses a technique for processing a $SiO_2$ (poly-Si or SiN or WSi) stacked film by using a gas containing nitrogen trifluoride ($NF_3$) and fluoromethane ($CH_3F$).

It is disclosed in PTL 2 that, in a cryogenic environment in which the temperature of a wafer is −30° C. or lower, a stacked film of a silicon oxide film and a silicon nitride film is etched by using a processing gas as a first processing gas, which contains hydrogen ($H_2$), carbon tetrafluoride ($CF_4$) and trifluoromethane ($CHF_3$), and the stacked film of a silicon oxide film and a silicon nitride film is etched by using a processing gas as a second processing gas, which contains hydrogen ($H_2$), carbon tetrafluoride ($CF_4$), trifluoromethane ($CHF_3$) and hydrogen bromide (HBr).

PRIOR ART LITERATURE

Patent Literature

PTL 1: JP-A-2015-144158
PTL 2: JP-A-2017-103388

SUMMARY OF INVENTION

Technical Problem

When the number of stacked layers of a device having a three-dimensional structure increases with integration, a ratio of a depth to an opening width, that is, an aspect ratio of a deep hole or a deep trench that penetrates a stacked film, increases. As the aspect ratio increases, the etching rate may decrease and a tapered shape may be formed. That is, it can be said that it is difficult to obtain an aspect ratio of a certain value or more. PTLs 1 and 2 describe methods for improving the tapered shape, but the decrease in etch rate is not taken into consideration. In the case where the etching rate decreases as the aspect ratio increases, processing time increases exponentially for obtaining a processed shape having a high aspect ratio, and the throughput of plasma processing is seriously affected.

In order to solve the above-mentioned problems in the related art, the invention provides a plasma processing apparatus and a plasma processing method for realizing a plasma etching method by which the tapered shape is improved and the decrease in etch rate is prevented.

Solution to Problem

In order to solve the above-mentioned problems, in the invention, there is provided a plasma processing method in which a first stacked film formed by alternately stacking a silicon oxide film and polycrystalline silicon, or a second stacked film formed by alternately stacking a silicon oxide film and a silicon nitride film, is etched by using a plasma. The first stacked film or the second stacked film is etched by using a mixed gas of a hydrogen bromide gas, a hydrofluorocarbon gas and a nitrogen element-containing gas.

In order to solve the above-mentioned problems, in the invention, there is provided a plasma processing method in which a stacked film formed by alternately stacking a silicon oxide film and a silicon nitride film is etched by using a plasma. The stacked film is etched by using a mixed gas of a hydrogen bromide gas, a fluoromethane ($CH_3F$) gas and a nitrogen gas.

In order to solve the above-mentioned problems, in the invention, there is provided a plasma processing method in which a first stacked film formed by alternately stacking a silicon oxide film and polycrystalline silicon, or a second stacked film formed by alternately stacking a silicon oxide film and a silicon nitride film, is etched by using a plasma. The first stacked film or the second stacked film is etched by using a mixed gas of a fluoromethane ($CH_3F$) gas, a nitrogen gas and a chlorine gas, or by using a mixed gas of a fluoromethane ($CH_3F$) gas, a nitrogen gas, and a boron trichloride ($BCl_3$) gas.

In order to solve the above-mentioned problems, in the invention, there is provided a plasma processing method in which a stacked film formed by alternately stacking a silicon oxide film and a metal film is etched by using a plasma. The stacked film is etched by using a mixed gas of a hydrogen bromide gas, a fluoromethane ($CH_3F$) gas and a nitrogen element-containing gas.

In order to solve the above-mentioned problems, in the invention, there is provided a plasma processing apparatus that includes : a processing chamber in which a sample is subjected to plasma processing; a first radio frequency power source that supplies radio frequency power for generating a plasma; a sample stage on which the sample is placed; a second radio frequency power source that supplies radio frequency power to the sample stage; and a control unit that controls the first radio frequency power source and the second radio frequency power source so as to etch a stacked film formed by alternately stacking a silicon oxide film and a polycrystalline silicon, or a stacked film formed by alternately stacking a silicon oxide film and a silicon nitride film, by using the plasma generated by a mixed gas of a hydrogen bromide gas, a hydrofluorocarbon gas and a nitrogen element-containing gas.

In order to solve the above-mentioned problems, in the invention, there is provided a plasma processing apparatus that includes: a processing chamber; an upper electrode disposed on an upper side in the processing chamber; a sample stage that is disposed on a lower side in the processing chamber opposite the upper electrode and on which a sample to be processed is placed; a gas supply unit that supplies an etching gas to the processing chamber; a radio frequency power applying unit that applies radio frequency power to the upper electrode; a temperature measurement unit that measures temperature of the sample stage; a cooling gas supply unit that supplies a cooling gas to between the sample to be processed placed on the sample stage and the sample stage; a refrigerant circulation unit that circulates a temperature-controlled refrigerant in a flow path formed inside the sample stage; and a control unit that controls the gas supply unit, the radio frequency power applying unit, the cooling gas supply unit and the refrigerant circulation unit. At time of controlling the gas supply unit and the radio frequency power applying unit to generate a plasma in the processing chamber so as to perform plasma etching processing on the sample to be processed placed on the sample stage, the control unit, according to temperature information of the sample stage measured by the temperature measurement unit and based on a relationship stored in advance between temperature of the sample stage and temperature of the sample to be processed placed on the sample stage, controls the cooling gas supply unit and the refrigerant circulation unit so as to maintain the temperature of the sample to be processed at a predetermined temperature during the plasma etching processing. The gas supply unit is controlled by the control unit to supply a mixed gas as the etching gas into the processing chamber so as to form a compound, which has an effect of promoting the plasma etching processing of the sample to be processed, on a surface of the sample to be processed which is maintained at the predetermined temperature.

Advantageous Effect

According to the invention, in a process of forming a deep hole or a deep trench having a high aspect ratio in a stacked film of a silicon-containing film and a silicon oxide film by plasma etching, the decrease in etch rate can be prevented and the processing throughput can be improved. Further, the cross-sectional shape of the deep hole or the deep trench can be made vertical.

DESCRIPTION OF EMBODIMENTS

In the invention, in a state where a plasma is generated in a processing chamber, gases in contact with a surface of a stacked film of a sample react with each other to form a compound on the surface of the stacked film which evenly contributes to etching each film constituting the stacked film, so that a deep hole pattern is formed in the stacked film in a single process.

The invention relates to a plasma processing apparatus and a plasma etching method, in which a decrease in etch rate can be prevented and processing throughput can be improved in a process of forming, by plasma etching, a deep hole or a deep trench having a high aspect ratio in a multilayered stacked film of a semiconductor device.

In the invention, in a process of forming, by plasma etching, a deep hole or a deep trench having a high aspect ratio in a multilayered stacked film of a semiconductor device, a compound, which has an etching processing gas as a component and promotes etching of the stacked film, is generated on a surface of the stacked film whose temperature is controlled during plasma etching processing. By performing plasma etching on the generated compound, etching rate of the stacked film can be improved equally for each film constituting the stacked film, and the etching can be reliably performed up to the bottom of the deep hole. Accordingly, the stacked film can be reliably etched in a single process.

When the invention is applied to a manufacturing process of a 3-D NAND flash memory device, in a process where plasma etching processing is performed by using a plasma of a mixed gas containing HBr, $CH_3F$ and a nitrogen-containing gas (such as nitrogen ($N_2$) and ammonia ($NH_3$)), by forming a compound of ammonium bromide in the plasma and on a surface of a film in which silicon oxide films (silicon nitride films or silicon) are alternately stacked and whose temperature is controlled, a deep hole or a deep trench having a high aspect ratio can be formed while a decrease in etching rate is prevented and a cross-sectional shape thereof is made substantially vertical.

Hereinafter, embodiments of the invention will be described with reference to the drawings.

First Embodiment

Figure 1:
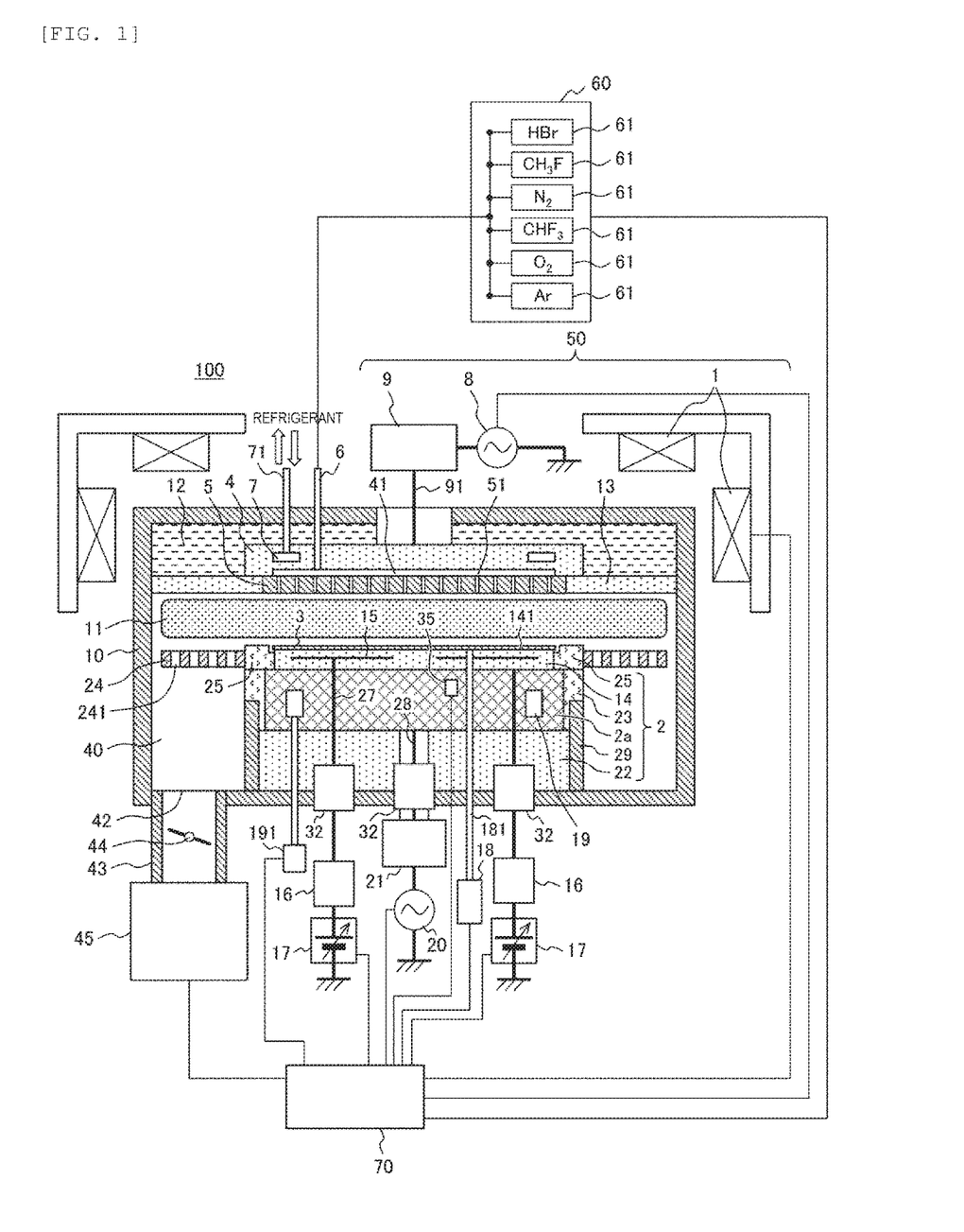
FIG. 1 is a cross-sectional view showing a schematic configuration of a plasma processing apparatus according to an embodiment of the invention.

FIG. 1 is a longitudinal sectional view showing a schematic configuration of a plasma processing apparatus 100 according to the embodiment of the invention.

The plasma processing apparatus 100 in FIG. 1 is a parallel plate plasma processing apparatus that produces a magnetic field by using electromagnetic coils 1 which are solenoid coils. The plasma processing apparatus 100 according to the present embodiment includes a vacuum vessel 10 whose inner space defines a processing chamber 40 in which a sample to be processed is placed and a processing gas is supplied to form a plasma. Further, the plasma processing apparatus 100 includes: a plasma formation unit 50 that is disposed above the vacuum vessel 10 and generates an electric field or a magnetic field for forming a plasma in the processing chamber 40; an evacuation unit 45 that is connected to a lower portion of the vacuum vessel 10 and includes a vacuum pump such as a turbo molecular pump for depressurizing by evacuating the processing chamber 40; and a control unit 70 that controls the entire plasma processing apparatus 100.

The processing chamber 40 of the vacuum vessel 10 includes a cylindrical sample stage 2 on a lower side thereof.

An upper surface of the sample stage 2 is formed with a placement surface 141 on which a substrate-like sample 3 to be processed (hereinafter, referred to as sample 3) such as a semiconductor wafer is placed. Above the placement surface 141, an upper electrode 4 in a disk shape is disposed opposite the placement surface 141 and is supplied with a radio frequency power to form a plasma. On a side of the upper electrode 4 close to the sample 3, a shower plate 5 in a disk shape including a plurality of through holes 51 is disposed opposite the placement surface 141 of the sample stage 2, forming a ceiling surface of the processing chamber 40. The plurality of through holes 51 supply and disperse a gas to the processing chamber 40.

A gap 41 is formed between the shower plate 5 and the upper electrode 4 when the shower plate 5 and the upper electrode 4 are attached to the vacuum vessel 10. The upper electrode 4 is an antenna disposed to an upper side of the shower plate 5. The gas is introduced into the gap 41 from a gas introduction line 6, which is connected to a gas supply unit 60 outside the vacuum vessel 10, via a gas flow path provided in the upper electrode 4. The gas supply unit 60 includes a plurality of mass flow controllers 61 corresponding to categories of gases to be supplied, and each of the mass flow controllers 61 is connected to a gas cylinder (not shown). After being dispersed in the gap 41, the gas supplied to the gap 41 is supplied to the processing chamber 40 through the plurality of through holes 51 arranged in a region including a central portion of the shower plate 5.

Gases supplied from the gas supply unit 60 into the processing chamber 40 through the plurality of through holes 51 include, for example, a processing gas used for processing the sample 3, or an inert gas that is not directly used for processing but to dilute the processing gas or to be supplied to the processing chamber 40 to replace the processing gas when the processing gas is not supplied.

An upper electrode refrigerant flow path 7 is formed in the upper electrode 4. The upper electrode refrigerant flow path 7 is connected to a refrigerant supply line 71 that is connected to a temperature control device (not shown) such as a chiller that adjusts the temperature of a refrigerant to a predetermined range. The refrigerant whose temperature is adjusted to a predetermined range by the temperature control device (not shown) is supplied into the upper electrode refrigerant flow path 7 via the refrigerant supply line 71 for circulation, so that the temperature of the upper electrode 4 is adjusted to a range of values suitable for processing by heat exchange.

The upper electrode 4 is formed of a disk-like member made of a conductive material such as aluminum or stainless steel. A coaxial cable 91 is electrically connected to a central portion of an upper surface of the upper electrode 4 to transmit radio frequency power for plasma formation. The radio frequency power for plasma formation is supplied, via a radio frequency power matching unit 9 for discharge, to the upper electrode 4 from a radio frequency power source 8 for discharge (hereinafter, referred to as radio frequency power source 8) that is electrically connected to the upper electrode 4 via the coaxial cable 91, so that an electric field is released to the processing chamber 40 from a surface of the upper electrode 4 through the shower plate 5. In the present embodiment, an electric power of 200 MHz, which is a frequency of the very radio frequency band (VHF band), is used as the radio frequency power for plasma formation applied to the upper electrode 4 from the radio frequency power source 8.

The electromagnetic coils 1 are disposed at positions outside the vacuum vessel 10 which surround upper sides and lateral sides of an upper portion of the processing chamber 40. A magnetic field generated by the electromagnetic coils 1 is formed in the processing chamber 40.

The shower plate 5 is formed of a dielectric material such as quartz or a semiconductor such as silicon. In this way, when the radio frequency power for plasma formation is applied from the radio frequency power source 8 to the upper electrode 4, the electric field formed by the upper electrode 4 can be transmitted through the shower plate 5.

The upper electrode 4 is electrically insulated from the vacuum vessel 10 by an upper electrode insulator 12 in a ring shape which is formed of a dielectric material such as quartz or Teflon (registered trademark) and is disposed on upper sides and lateral sides of the upper electrode 4. Similarly, an insulation ring 13 formed of a dielectric material such as quartz is disposed around the shower plate 5, so that the shower plate 5 is insulated from the vacuum vessel 10. The upper electrode insulator 12, the insulation ring 13, the upper electrode 4 and the shower plate 5 are fixed to a lid member (not shown) constituting an upper portion of the vacuum vessel 10, and revolve integrally with the lid member during operation of opening and closing the lid member.

A sidewall of the cylindrical vacuum vessel 10 is connected to a transfer vessel (not shown) that is a vacuum vessel from whose depressurized inner portion the sample 3 is transferred. A gate is disposed between the sidewall and the transfer vessel, which serves as an opening of a passage through which the sample 3 is taken in and out. A gate valve is disposed to hermetically seal the vacuum vessel 10 by closing the gate when the sample 3 is processed in the vacuum vessel 10.

An evacuation opening 42 connected to the evacuation unit 45 that evacuates the processing chamber 40 is disposed to a lower side of the sample stage 2 in the processing chamber 40, in a low portion of the vacuum vessel 10. A pressure adjustment valve 44, which is a plate-like valve, is disposed in an evacuation path 43 that is disposed between the evacuation opening 42 and a vacuum pump (not shown) of the evacuation unit 45 to connect the evacuation opening 42 and the vacuum pump. The plate-like pressure adjustment valve 44 crosses a cross section of the evacuation path 43 and rotates around an axis to increase or decrease a cross-sectional area of a flow path.

A rotation angle of the pressure adjustment valve 44 is adjusted by the control unit 70, so that the flow rate or speed of an evacuated gas from the processing chamber 40 can be increased or decreased. The pressure in the processing chamber 40 is adjusted by the control unit 70 within a desired range through a balance between the flow rate or speed of a gas supplied from the through holes 51 of the shower plate 5 and the flow rate or speed of a gas or particles evacuated from the evacuation opening 42 to the evacuation unit 45.

Next, a peripheral structure of the sample stage 2 will be described. The sample stage 2 according to the present embodiment is a cylindrical stage disposed in a central portion of a lower side of the processing chamber 40 and includes a metallic base member 2a having a cylindrical shape or a disk shape therein.

The base member 2a according to the present embodiment is electrically connected to a radio frequency power source 20 for bias through a power supply path 28 including a coaxial cable via a radio frequency power matching unit 21 for bias disposed on the power supply path 28. The radio frequency power for bias applied to the base member 2a from the radio frequency power source 20 for bias has a frequency (4 MHz in this example) different from that of the radio frequency power for plasma formation applied to the upper electrode 4 from the radio frequency power source 8. Elements 32 such as a resistor or a coil are disposed on the power supply path 28 and are connected to the radio frequency power matching unit 21 for bias and the radio frequency power source 20 for bias that are grounded.

When the radio frequency power for plasma formation is applied from the radio frequency power source 8 to the upper electrode 4 and a plasma 11 is generated between the sample stage 2 and the shower plate 5, a bias potential is generated on the base member 2a by supplying the radio frequency power from the radio frequency power source 20 for bias to the base member 2a. Due to the bias potential, charged particles such as ions in the plasma 11 are attracted to an upper surface of the sample 3 or the placement surface 141. That is, the base member 2a functions as a lower electrode below the upper electrode 4, to which the radio frequency power for bias is applied.

In the base member 2a, a refrigerant flow path 19 is arranged in a concentric or spiral manner to circulate a refrigerant that is adjusted to a predetermined temperature by a temperature control device 191 such as a chiller.

On an upper surface of the base member 2a, an electrostatic attraction film 14 is disposed. The electrostatic attraction film 14 is formed of a dielectric material such as alumina or yttria and includes a tungsten electrode 15 therein to which direct current power for electrostatically attracting the sample 3 is supplied. A power supply path 27 that penetrates the base member 2a is connected to a back surface of the tungsten electrode 15. The tungsten electrode 15 is electrically connected to a direct current power source 17 through the power supply path 27 via the elements 32 such as a resistor or a coil and a low pass filter 16 that is grounded.

A terminal on one end side of the direct current power source 17 and a terminal on one end side of the radio frequency power source 20 for bias according to the present embodiment are grounded or electrically connected to the ground.

The low pass filter 16, which filters and blocks flow of a current of a higher frequency, and the radio frequency power matching unit 21 for bias are arranged to prevent the radio frequency power for plasma formation from flowing into the direct current power source 17 and the radio frequency power source 20 for bias from the radio frequency power source 8.

The direct current power from the direct current power source 17 and the radio frequency power from the radio frequency power source 20 for bias are supplied to the electrostatic attraction film 14 and the sample stage 2 respectively without loss. However, the radio frequency power for plasma formation flowing from the sample stage 2 to the direct current power source 17 and the radio frequency power source 20 for bias flows to the ground via the low pass filter 16 or the radio frequency power matching unit 21 for bias. Although the low pass filter 16 is not shown on the power supply path 28 from the radio frequency power source 20 for bias in FIG. 1, a circuit having the same effect as that of the low pass filter 16 is provided in the radio frequency power matching unit 21 for bias that is shown in the drawing.

With such a configuration, impedance of electric power from the radio frequency power source 8 is relatively low when the direct current power source 17 and the radio frequency power source 20 for bias are viewed from the sample stage 2. In the present embodiment, the elements 32 such as a resistor or a coil for increasing the impedance are inserted on the power supply paths between the electrode and the low pass filter 16 and between the electrode and the radio frequency power matching unit 21 for bias, so that the impedance of the radio frequency power for plasma formation is high (100Ω or more in the present embodiment) when the direct current power source 17 or the radio frequency power source 20 for bias is viewed from the sample stage 2.

In the embodiment shown in FIG. 1, a plurality of the tungsten electrodes 15 are provided in the electrostatic attraction film 14, and bipolar electrostatic attraction is performed in which a direct current voltage is supplied so that one of the tungsten electrodes 15 has a polarity different from that of another tungsten electrode 15. For this reason, the electrostatic attraction film 14 forming the placement surface 141 is equally divided into two parts having the same area of surfaces in contact with the sample 3 or divided into two regions where the tungsten electrodes 15 have different polarities at a value within a range approximately equal to the extent that the area of surface in contact with the sample 3 is equally divided into two parts, and direct current powers of independent values are supplied to the two regions respectively and voltages of different values are maintained.

A helium gas is supplied from a helium supply unit 18 via a pipe 181 to between the electrostatic attraction film 14 and a back surface of the sample 3 that are in contact with each other due to being electrostatically attracted. Accordingly, the efficiency of heat transmission between the sample 3 and the electrostatic attraction film 14 can be improved, the exchange amount of heat with the refrigerant flow path 19 in the base member 2a can be increased, and the efficiency of adjusting the temperature of the sample 3 is improved.

An insulation plate 22 in a disk shape and formed of Teflon (registered trademark) or the like, is disposed on a lower side of the base member 2a. Accordingly, the base member 2a, which is set to ground potential by being grounded or being electrically connected to the ground, is electrically insulated from a lower member constituting the processing chamber 40. Further, an insulation layer 23 in a ring shape and formed of a dielectric material such as alumina is disposed around side surfaces of the base member 2a so as to surround the base member 2a.

A conductive plate 29 formed of a conductive material, which is set to ground potential by being grounded or being electrically connected to the ground, is disposed around the insulation plate 22 and the insulation layer 23. The insulation plate 22 is disposed on the lower side of the base member 2a and in contact with the base member 2a, and the insulation layer 23 is disposed on an upper side of the insulation plate 22 to surround the base member 2a. The conductive plate 29 is a plate member that presents a circular shape or a similar shape when viewed from above. The insulation layer 23 is interposed between the conductive plate 29 and the base member 2a, and thus the conductive plate 29 and the base member 2a are electrically insulated from each other.

A susceptor ring 25 formed of a dielectric such as quartz or a semiconductor such as silicon is disposed on an upper side of the ring-like insulation layer 23. The susceptor ring 25 is disposed around the sample 3 and the base member 2a is covered by the susceptor ring 25 and the insulation layer 23, so that distribution of reaction products around outer ends of the sample 3 is controlled and a uniform processing performance is realized.

As described above, the sample stage 2 includes: the base member 2a; the electrostatic attraction film 14 that includes the tungsten electrodes 15 therein; the insulation plate 22 on which the base member 2a is placed and which electrically insulates the base member 2a from the vacuum vessel 10; the insulation layer 23 formed of an insulation material which surrounds the base member 2a; the susceptor ring 25 that covers the upper surface of the base member 2a and side surfaces of the electrostatic attraction film 14; and the conductive plate 29 that covers an outer peripheral portion of the insulation plate 22 and an outer peripheral portion of the insulation layer 23.

A shield plate 24 in a concentric and plate shape is disposed on an outer peripheral side of the susceptor ring 25 and is in contact therewith. The shield plate 24 is provided to bias the plasma 11 formed in the processing chamber 40 toward an upper portion of the sample stage 2 so as to prevent a formation region of the plasma 11 from expanding to side surfaces of the sample stage 2, that is, to confine the plasma 11. A plurality of holes 241 are formed in the plate-like shield plate 24 in order to allow gases and particles to pass in a vertical direction.

A temperature measurement device 35 embedded in the base member 2a measures the temperature of the base member 2a. When another temperature measurement device (not shown) is disposed on a surface of the sample 3, the sample 3 is heated by a heating unit (not shown) to change the temperature of the sample 3, while a database is created and stored in advance for a relationship between the surface temperature of the sample 3 measured at this time by the temperature measurement device (not shown) and the temperature of the base member 2a measured by the temperature measurement device 35 embedded in the base member 2a. When the plasma 11 is formed and the sample 3 is actually processed in the processing chamber 40, by referring to the database, the temperature of the sample 3 during plasma processing can be estimated based on the temperature of the base member 2a measured by the temperature measurement device 35 embedded in the base member 2a.

Next, the sample 3, on which the processing is performed by using the plasma processing apparatus 100, will be described.

Figure 2:
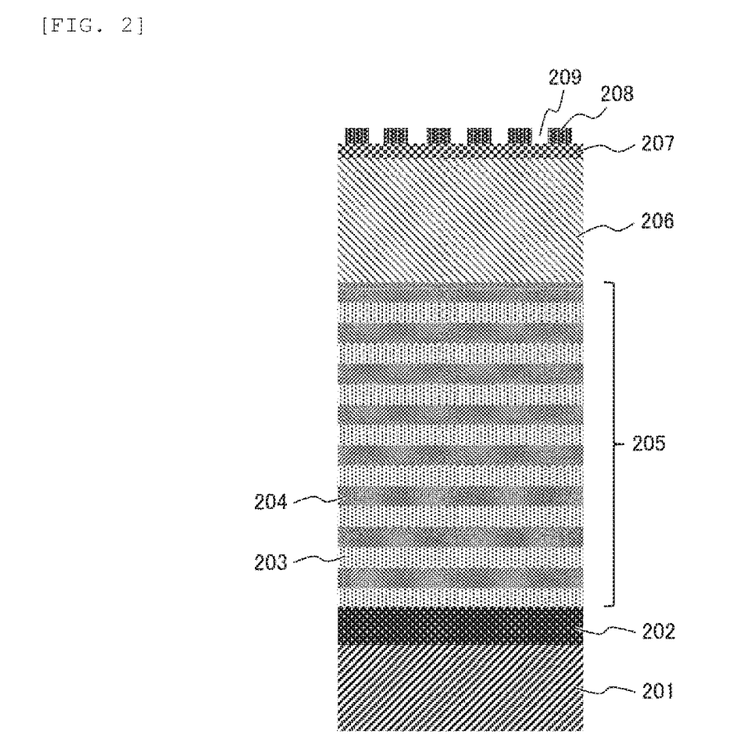
FIG. 2 is a cross-sectional view showing a part of a cross-sectional structure of a sample before plasma processing according to the embodiment of the invention.

A part of a cross section of the sample 3 before the plasma processing as shown in FIG. 2 includes: a stopper film 202 of 50 to 200 nm on a silicon wafer substrate 201; an alternately stacked film 205 on the stopper film 202 in which a polycrystalline silicon (poly-Si) film 203 of 30 to 100 nm and a silicon oxide ($SiO_2$) film 204 of 30 to 100 nm are alternately stacked by n sets; a hard mask film 206 on the alternately stacked film 205 of 300 to 1000 nm formed of carbon or the like; an antireflection film 207 on the hard mask film 206 of 50 to 300 nm; and a resist film 208 at an uppermost portion.

A number of hole patterns 209 are formed in the resist film 208 at equal pitches. The hole patterns 209 have a diameter of 100 nm and a hole pitch of 200 nm.

Figure 3:
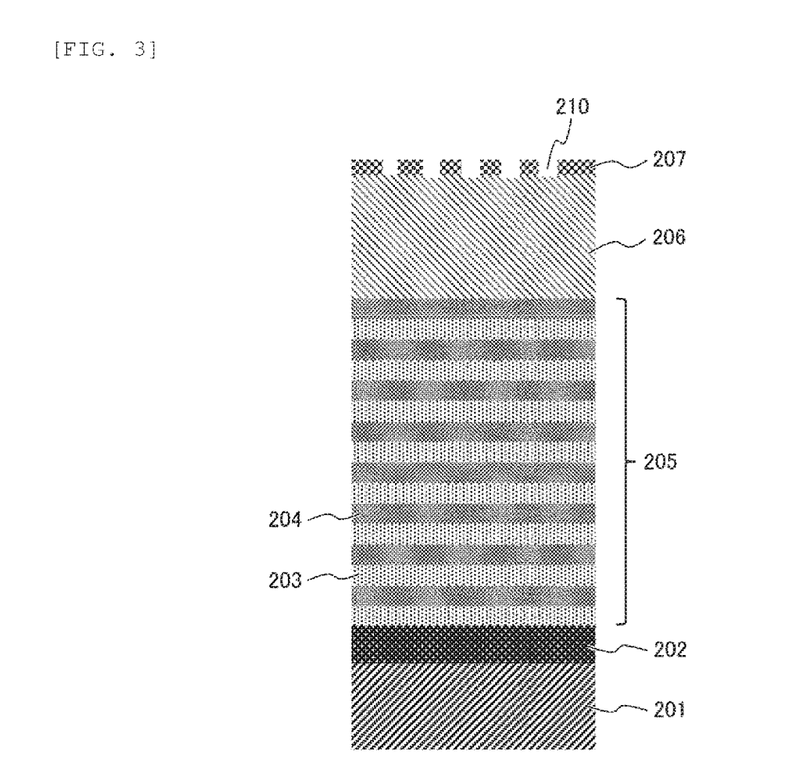
FIG. 3 is a cross-sectional view showing a part of the cross-sectional structure in a state in which a resist pattern is transferred to an antireflection film of the sample according to the embodiment of the invention.

For the sample 3 as shown in FIG. 2, a trifluoromethane ($CHF_3$) gas is introduced into the processing chamber 40 to form a plasma, and by etching the antireflection film 207 masked by the resist film 208, the hole patterns 209 formed in the resist film 208 are transferred to the antireflection film 207 and hole patterns 210 are formed in the antireflection film 207 as shown in FIG. 3.

Figure 4:
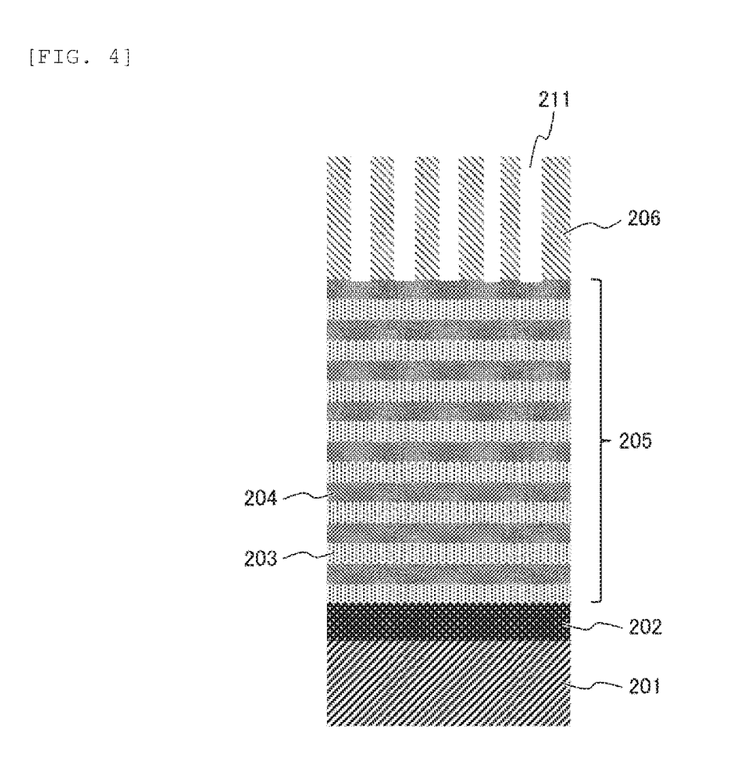
FIG. 4 is a cross-sectional view showing a part of the cross-sectional structure in a state in which an antireflection film pattern is transferred to a hard mask film of the sample according to the embodiment of the invention.

Next, the category of gas introduced into the processing chamber 40 is switched to an oxygen ($O_2$) gas and a plasma is formed in the processing chamber to which the $O_2$ gas is supplied, thereby etching the hard mask film 206 masked by the antireflection film 207. Accordingly, the hole patterns 210 formed in the antireflection film 207 are transferred to the hard mask film 206 masked by the antireflection film 207, and hole patterns 211 are formed in the hard mask film 206 as shown in FIG. 4.

Figure 5:
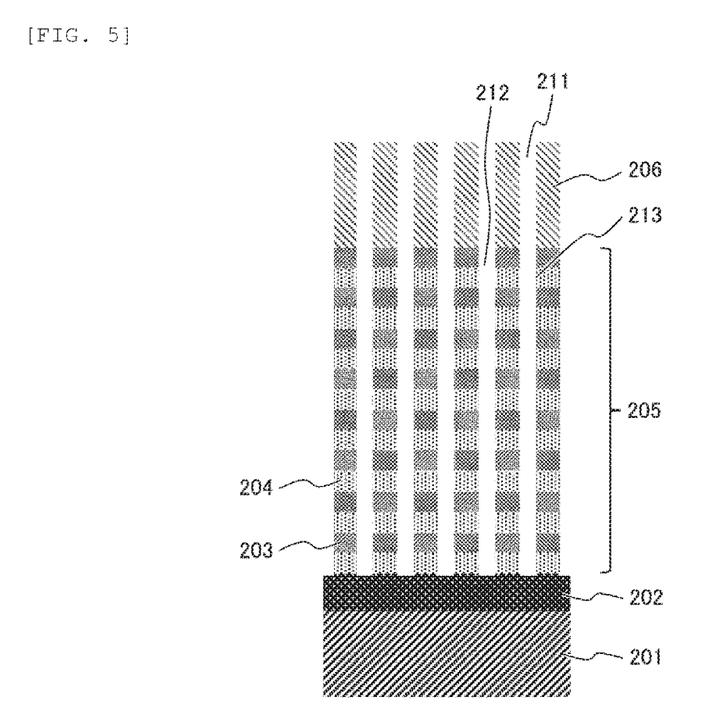
FIG. 5 is a cross-sectional view showing a part of the cross-sectional structure in a state in which a hard mask film pattern is transferred to an alternately stacked film of the sample according to the embodiment of the invention.

Next, the category of gas introduced into the processing chamber 40 is switched to a process gas for etching the alternately stacked film 205 in which the polycrystalline silicon (poly-Si) film 203 and the silicon oxide ($SiO_2$) film 204 are alternately stacked by n sets, and a plasma is formed in the processing chamber to which the process gas is supplied, thereby etching the alternately stacked film 205 masked by the hard mask film 206. At this time, the helium supply unit 18 and the temperature control device 191 are controlled to cause the temperature of the sample 3 to be 20° C. based on the temperature of the base member 2a measured by the temperature measurement device 35. Accordingly, the hole patterns 211 formed in the hard mask film 206 are transferred to the alternately stacked film 205 masked by the hard mask film 206, and hole patterns 212 reaching the stopper film 202 are formed in the alternately stacked film 205 as shown in FIG. 5.

In the plasma etching processing of the alternately stacked film 205 in the present embodiment, at least a hydrogen bromide (HBr) gas, a fluoromethane ($CH_3F$) gas, and a nitrogen ($N_2$) gas are used as the process gas. The pressure adjustment valve 44 in the processing chamber 40 is controlled by the control unit 70 to set the processing pressure between 1 Pa and 8 Pa, a wafer radio frequency power for bias applied from the radio frequency power source 20 for bias to the base member 2a of the sample stage 2 is set between 1000 W and 4000 W, and the radio frequency power for plasma formation applied from the radio frequency power source 8 to the upper electrode 4 is set between 400 W and 1500 W.

Figure 6:
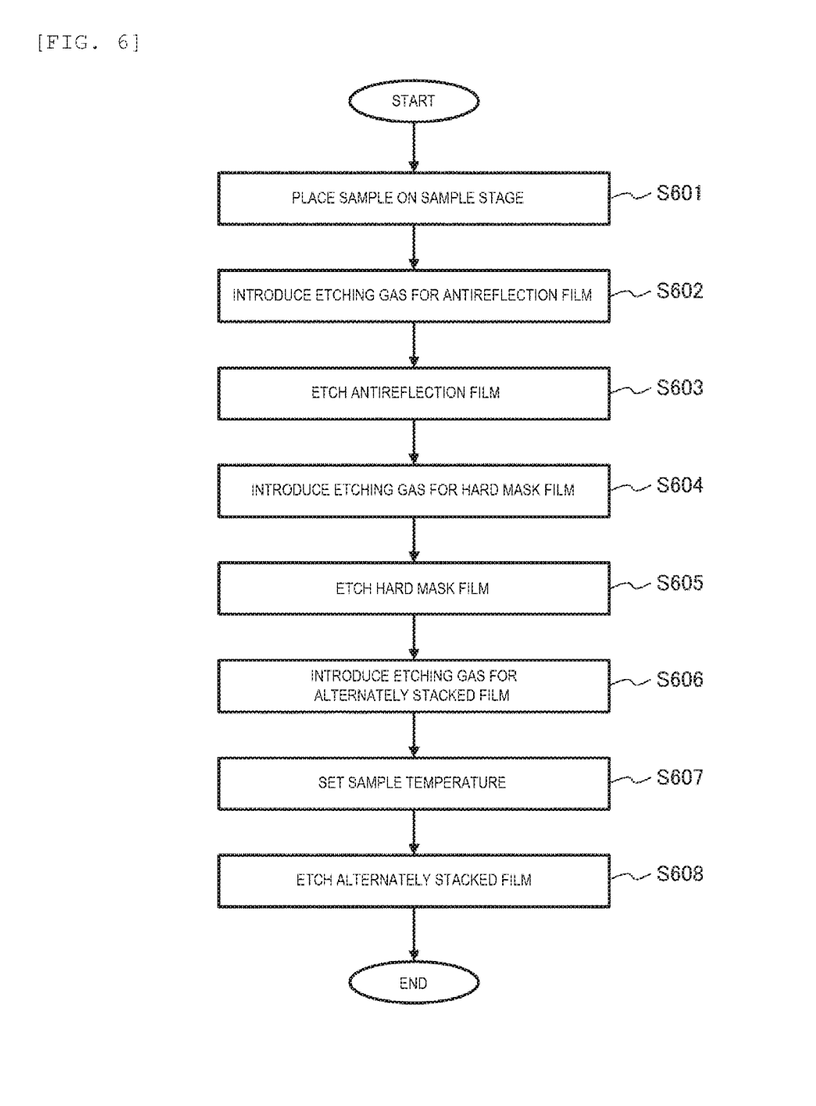
FIG. 6 is a flowchart showing a processing flow of the sample according to the embodiment of the invention.

FIG. 6 is a flowchart showing the processing of forming the hole patterns (through-Via) 212 in the alternately stacked film 205 using the plasma processing apparatus 100.

In the processing of forming the hole patterns (through-Via) 212 in the alternately stacked film 205, a wafer as the sample 3 is first placed on the sample stage 2 in the processing chamber 40 of the plasma processing apparatus 100 (S601). Here, multiple layers of films are formed in the wafer, which is the sample 3, as the cross section shown in FIG. 2, and a number of the fine hole patterns 209 are formed in the resist film 208 on the surface.

Next, the gas supply unit 60 is controlled by the control unit 70 to supply a trifluoromethane ($CHF_3$) gas as an etching gas for etching the antireflection film 207 formed in the sample 3, from the gas introduction line 6 to the gap 41 between the upper electrode 4 and the shower plate 5, and the trifluoromethane ($CHF_3$) gas is introduced into the processing chamber 40 through a number of through holes 51 formed in the shower plate 5 (S602). The $CHF_3$ gas introduced into the processing chamber 40 is evacuated from the evacuation unit 45 to the outside of the processing chamber 40 through the evacuation opening 42. At this time, the evacuation amount of the $CHF_3$ gas is adjusted by adjusting an opening degree of the pressure adjustment valve 44 controlled by the controller 70.

Next, the direct current power source 17 is controlled by the control unit 70 to apply a direct current voltage to the tungsten electrodes 15 so as to generate an electrostatic force on the surface of the electrostatic attraction film 14, so that the sample 3 placed on the sample stage 2 is attracted to the electrostatic attraction film 14 on the surface of the sample stage 2. In this state, the helium supply unit 18 is controlled by the control unit 70 to supply a helium gas to the back surface of the sample 3 attracted from the pipe 181 to the electrostatic attraction film 14.

Next, in a state where a direct current power source (not shown) is controlled by the control unit 70 to supply a direct current to the electromagnetic coils 1 and accordingly a magnetic field is generated in a region including the inner portion of the processing chamber 40, the radio frequency power source 8 is controlled by the control unit 70 to apply a radio frequency power to the upper electrode 4 to generate the plasma 11 with the $CHF_3$ gas in the processing chamber, and the antireflection film 207 masked by the resist film 208 on the surface of the sample 3 is etched (S603). At this time, the radio frequency power source 20 for bias is controlled by the control unit 70 to apply a radio frequency power to the base member 2a of the sample stage 2 to generate a bias potential on the base member 2a, and the energy of ions to be attracted from the plasma 11 to the sample 3 is controlled.

The etching is performed for a predetermined time. Thereafter, the radio frequency power source 8 is controlled by the control unit 70 to stop applying the radio frequency power to the upper electrode 4, the radio frequency power source 20 for bias is controlled by the control unit 70 to stop applying the radio frequency power to the base member 2a of the sample stage 2, and the generation of the plasma 11 in the processing chamber 40 is stopped. In this state, the gas supply unit 60 is controlled by the control unit 70 to stop the supply of the $CHF_3$ gas from the gas introduction line 6.

Next, the gas supply unit 60 is controlled by the control unit 70 to supply an etching gas, which contains an $O_2$ gas, as an etching gas for the hard mask film 206 from the gas introduction line 6 to the gap 41 between the upper electrode 4 and the shower plate 5, and the etching gas is introduced into the processing chamber 40 through a number of through holes 51 formed in the shower plate 5 (S604). At this time, the angle of rotation of the pressure adjustment valve 44 is adjusted by the control unit 70 to increase or decrease the flow rate or speed of the evacuated gas from the processing chamber 40, thereby setting the pressure in the processing chamber 40 to a predetermined pressure.

In this state, a voltage is applied from the direct current power source (not shown) to the electromagnetic coils 1 for excitation so as to generate a magnetic field in the processing chamber 40, and a radio frequency power is supplied from the radio frequency power source 8 to the upper electrode 4, thereby generating the plasma 11 with the etching gas containing the $O_2$ gas in the processing chamber 40. On the other hand, on the sample stage 2, a radio frequency power for bias is applied from the radio frequency power source 20 for bias to the base member 2a.

As described above, the plasma etching processing is performed on the sample 3 in a state where the plasma 11 is generated in the processing chamber 40 to which the etching gas containing the $O_2$ gas is supplied (S605). Accordingly, the hole patterns 210 formed in the antireflection film 207 are transferred to the hard mask film 206 to form the hole patterns 211 in the hard mask film 206 as shown in FIG. 4.

When the hole patterns 210 of the antireflection film 207 are transferred to the hard mask film 206 and the hole patterns 211 are formed in the hard mask film 206, the application of the radio frequency power from the radio frequency power source 8 to the upper electrode 4, as well as the application of radio frequency power for bias from the radio frequency power source 20 for bias to the base member 2a, is stopped, and the supply of the etching gas containing the $O_2$ gas from the gas introduction line 6 is stopped.

Next, the gas supply unit 60 is controlled by the control unit 70 to introduce a processing gas (process gas) for processing the alternately stacked film 205, in which the polycrystalline silicon (poly-Si) film 203 and the silicon oxide ($SiO_2$) film 204 are alternately stacked by n sets, from the gas introduction line 6 to the upper electrode 4, and the processing gas is supplied into the processing chamber 40 (S606). At this time, the angle of rotation of the pressure adjustment valve 44 is adjusted by the control unit 70 to increase or decrease the flow rate or speed of the evacuated gas from the processing chamber 40, thereby setting the pressure in the processing chamber 40 to the predetermined pressure. A mixed gas at least containing a hydrogen bromide (HBr) gas, a fluoromethane ($CH_3F$) gas, and a nitrogen ($N_2$) gas is used as the process gas.

Based on the temperature of the base member 2a measured by the temperature measurement device 35, the helium gas supply unit 18 and the temperature control device 191 are controlled by the control unit 70 based on the relationship stored in the database between the temperature of the base member 2a measured by the temperature measurement device 35 and the temperature of the sample 3 (S607); the temperature of the sample 3 during the plasma etching processing on the alternately stacked film 205 is maintained at 20° C. by adjusting the flow rate of the helium gas supplied from the pipe 181 to between the sample 3 and the electrostatic attraction film 14, as well as the temperature and the flow rate of the refrigerant flowing in the refrigerant flow path 19 in the base member 2a.

In this state, a voltage is applied from the direct current power source (not shown) to the electromagnetic coils 1 for excitation so as to generate a magnetic field in the processing chamber 40, and a radio frequency power is supplied from the radio frequency power source 8 to the upper electrode 4, thereby generating the plasma 11 in the processing chamber 40. On the other hand, on the sample stage 2, a radio frequency power for bias is applied from the radio frequency power source 20 for bias to the base member 2a. At this time, the pressure adjustment valve 44 is controlled by the control unit 70 to set the processing pressure in the processing chamber 40 between 1 Pa and 8 Pa, the wafer radio frequency power for bias applied from the radio frequency power source 20 for bias to the base member 2a of the sample stage 2 is set between 1000 W and 4000 W, and the radio frequency power for plasma formation applied from the radio frequency power source 8 to the upper electrode 4 is set between 400 W and 1500 W.

As described above, the plasma etching processing is performed on the sample 3 in a state where the plasma 11 is generated in the processing chamber 40 to which the processing gas (process gas) is supplied (S608). Accordingly, the hole patterns 211 in FIG. 5 formed in the hard mask film 206 are transferred to the alternately stacked film 205 to form the hole patterns 212 in the alternately stacked film 205 which reach the stopper film 202.

The wafer radio frequency power for bias applied from the radio frequency power source 20 for bias to the base member 2a of the sample stage 2, as well as the radio frequency power for plasma formation applied from the radio frequency power source 8 to the upper electrode 4, is applied as continuous waves or pulse waves separately. The plasma etching is performed on the sample 3 for a processing time until reaching the stopper film 202, and the hole patterns (through-Via) 212 are formed.

In the plasma etching processing of the alternately stacked film 205 in the present embodiment, at least a hydrogen bromide (HBr) gas, a fluoromethane ($CH_3F$) gas, and a nitrogen ($N_2$) gas are used as the process gas. The pressure adjustment valve 44 is controlled by the control unit 70 to set the processing pressure in the processing chamber 40 between 1 Pa and 8 Pa, the wafer radio frequency power for bias applied from the radio frequency power source 20 for bias to the base member 2*a* of the sample stage 2 is set between 1000 W and 4000 W, and the radio frequency power for plasma formation applied from the radio frequency power source 8 to the upper electrode 4 is set between 400 W and 1500 W.

As described above, by sequentially performing the process described above, the hole patterns (through-Via) 212 as shown in FIG. 5 can be formed in the sample 3 having a cross-sectional shape as shown in FIG. 2 in which the hole patterns 209 of the resist film 208 are formed on the surface.

In comparative example 1, the plasma etching is performed in the same manner, with the temperature of the sample 3 in the embodiment of the invention set at 40° C.

In comparative example 2, the plasma etching is performed in the same manner, with the temperature of the sample 3 in the embodiment of the invention set at 60° C.

In comparative example 3, the plasma etching is performed in the same manner, with the temperature of the sample 3 in the embodiment of the invention set at 80° C. A cross section of the sample 3 after the etching in comparative example 3 is shown in FIG. 7.

Figure 7:
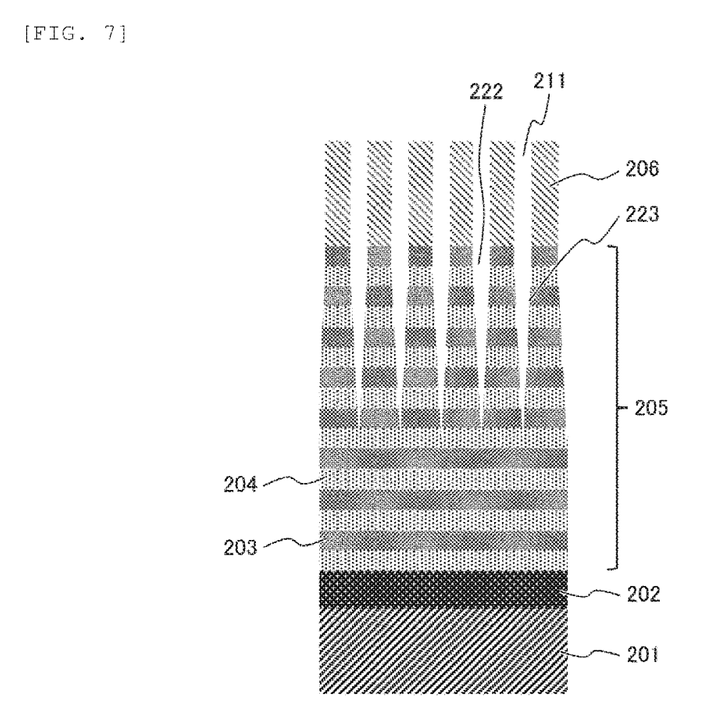
FIG. 7 is a cross-sectional view showing a part of a cross-sectional structure in a state in which a hard mask film pattern is transferred to an alternately stacked film of a sample after plasma processing according to comparative example 3 of the invention.

When FIG. 5 and FIG. 7 are compared, it is confirmed that sidewalls 213 of the hole patterns (through-Via) 212 in the first embodiment in FIG. 5 has significantly higher verticality and larger etching depth than those of sidewalls 223 of hole patterns (through-Via) 222 in comparative example 3 in FIG. 7.

The result can be described as follows.

When the plasma 11 is formed by applying a radio frequency power from the upper electrode 4 to a processing gas (process gas) containing HBr, $CH_3F$, and a nitrogen-containing gas in the processing chamber 40, radicals of nitrogen, hydrogen, and bromine are generated in the plasma 11. In this state, when the surface of the sample 3 is cooled to a low temperature of about 20° C., radicals attached to the surface of the sample 3 among the radicals generated in the plasma 11 form $NH_4Br$ (ammonium bromide) as a compound on the surface of the sample 3. The compound of ammonium bromide formed on the surface of the sample 3 has an effect of promoting the etching of the alternately stacked film 205, and accordingly the etching rate is improved.

In the present embodiment, since the compound of ammonium bromide is not formed in the gas phase but on the surface of the sample 3, the compound can be formed to the bottom of the fine structure of the hole patterns 212 during the formation of the hole patterns 212 in the alternately stacked film 205. Therefore, the formation amount of ammonium bromide is less dependent on a ratio of depth to hole diameter, that is, an aspect ratio, and the etching rate is accordingly less likely to decrease even when the hole becomes deeper during the etching.

That is, when the plasma is formed under a processing pressure of 0.4 Pa to 20 Pa with a mixed gas containing a HBr gas, a $N_2$ gas and a $CH_3F$ gas in the processing chamber 40, the temperature of the wafer is maintained at 20° C. or lower by controlling the stage temperature so that ammonium bromide is formed on the surface of the sample 3 from the mixed gas supplied to the processing chamber 40.

Ammonium bromide formed by this method has a property of reaching the bottom of a deep hole or a deep trench and being accumulated thereon and also acts as an etchant for a film to be etched. Accordingly, etching of a via or a trench progresses, and the decrease in the etching rate is small even when the depth is deep (even when the aspect ratio is high). Further, the etching of the bottom is promoted, so that the cross-sectional shape is made vertical as compared with that in a condition in which ammonium bromide is not formed.

That is, ammonium bromide is formed on the surface of the sample 3 during the plasma processing, and ammonium bromide formed on the surface during the plasma processing is actively used to perform the etching processing. Accordingly, the decrease in the etching rate can be prevented and the cross-sectional shape can be made vertical.

Figure 8:
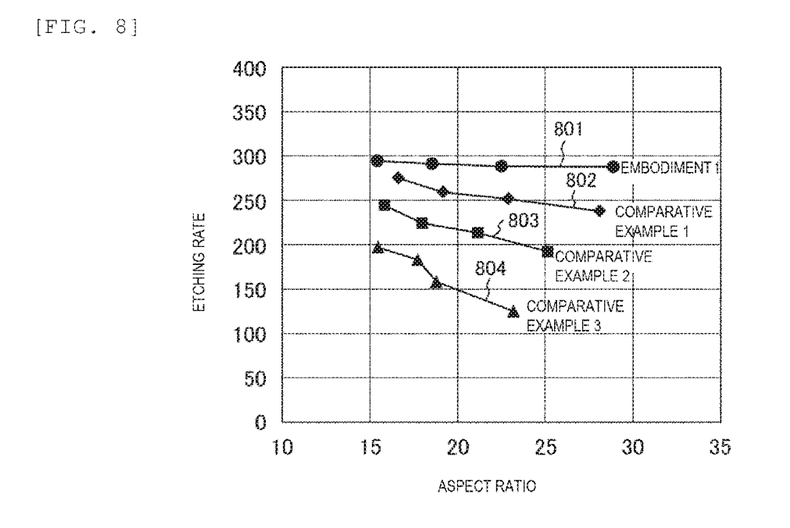
FIG. 8 is a graph showing relationships between aspect ratios and etching rates in the embodiment and comparative examples 1 to 3 of the invention.

FIG. 8 shows relationships between etching rates and aspect ratios of holes in the first embodiment and comparative examples 1 to 3. It is confirmed that the etching rates decrease as the aspect ratios increase in comparative examples 1 to 3, and that the etching rate is maintained even when the aspect ratio increases in the first embodiment. In comparative examples 1 to 3, temperatures of the sample 3 are higher than that of the sample 3 in the first embodiment. As described above, when the temperature of the sample 3 is high, it is understood that ammonium bromide is less likely to be formed on the surface of the sample 3, and it is considered that the formation of ammonium bromide has an influence on the etching rate.

Although FIG. 8 shows data in cases where the temperatures of the sample 3 are changed between 20° C. and 80° C., the same effect as that of the present embodiment can be obtained even when the temperature of the sample 3 is about −20° C.

When the temperature of the sample 3 is lower than −20° C., side etching of the hole patterns 209 formed in the alternately stacked film 205 proceeds and the cross-sectional shape of the hole patterns 209 is expanded into a bowing shape, causing a decrease in shape accuracy of the hole patterns 209. Therefore, when forming the hole patterns 209 in the alternately stacked film 205, the temperature of the sample 3 is preferably set between −20° C. and 20° C.

The above-mentioned embodiment describes an example in which the hole patterns 209 formed in the resist film 208 are transferred to the alternately stacked film 205; however, a trench pattern may be used instead of the hole patterns 209.

The above-mentioned embodiment describes the case where the alternately stacked film 205 is formed by alternately stacking the polycrystalline silicon film 203 and the silicon oxide film 204; however, a stacked film formed by alternately stacking a silicon oxide film, a silicon nitride film ($Si_3N_4$), and a tungsten silicide (WSi) or a silicon oxynitride film (SiON), or a stacked film formed by stacking a silicon oxide film and a thin film of metal such as tungsten (W), molybdenum (Mo), nickel (Ni), cobalt (Co) and ruthenium (Ru), can also be subjected to the etching processing in the same manner to form fine through holes reaching the stopper film 202.

Further, the above-mentioned embodiment describes the case where ammonium bromide is formed on the surface of the sample 3, but the invention is not limited thereto. For example, ammonium chloride ($NH_4Cl$) may be formed on the surface of the sample 3 and etch the alternately stacked film 205 to form the hole patterns (through-Via) 212. In this case, a mixed gas obtained by combining a fluoromethane ($CH_3F$) gas, a nitrogen-containing gas, and a chlorine ($Cl_2$) gas or a boron trichloride ($BCl_3$) gas may be used as a processing gas (process gas) for forming ammonium chloride ($NH_4Cl$) on the surface of the sample 3. Here, a nitrogen atom containing gas such as nitrogen ($N_2$), a nitrogen trifluoride ($NF_3$) gas, and ammonia ($NH_3$) may be used as the nitrogen-containing gas.

According to the present embodiment, in a state where a plasma of a mixed gas is generated in a processing chamber, gases in contact with a surface of a stacked film of a sample are made to react with each other to form a compound on the surface of the stacked film which evenly contributes to etching each film constituting the stacked film. Accordingly, the etching rate is not decreased, and a deep hole pattern whose cross-sectional shape is made vertical can be formed in the stacked film in a single process.

The invention made by the present inventor(s) is described above in detail based on the examples, but the invention is not limited to the above embodiment, and various changes can be made within the scope not departing from the gist of the invention. For example, the above-mentioned embodiment is described in detail for easy understanding of the invention, and the invention is not necessarily limited to those including all the configurations described above. In addition, a part of a configuration of the embodiment may be added, deleted, or replaced with another configuration.

INDUSTRIAL APPLICABILITY

The invention can be applied to a plasma processing apparatus that is used in a process of manufacturing a semiconductor device, and more specifically, to a plasma etching device.

REFERENCE SIGN LIST 1 electromagnetic coil
2 sample stage
2a base member
3 sample
4 upper electrode
5 shower plate
6 gas introduction line
7 upper electrode refrigerant flow path
8 radio frequency power source for discharge
9 radio frequency power matching unit for discharge
10 vacuum vessel
11 plasma
12 upper electrode insulator
13 insulation ring
14 electrostatic attraction film
15 tungsten electrode
16 low pass filter
17 direct current power source
18 helium supply unit
19 refrigerant flow path
20 radio frequency power source for bias
21 radio frequency power matching unit for bias
22 insulation plate
23 insulation layer
24 shield plate
25 susceptor ring
27 power supply path
29 conductive plate
30 gas passing hole
32 element
35 temperature measurement device
40 processing chamber
44 pressure adjustment valve
45 evacuation unit
50 plasma formation unit
70 control unit
100 plasma processing apparatus
191 temperature control device
201 silicon wafer substrate
202 stopper film
203 polycrystalline silicon film
204 silicon oxide film
205 alternately stacked film
206 hard mask film
207 antireflection film
208 resist film
212 hole pattern

The invention claimed is:

1. A plasma processing method in which a stacked film formed by alternately stacking a silicon oxide film and a polycrystalline silicon, or a stacked film formed by alternately stacking a silicon oxide film and a silicon nitride film, is etched by using a plasma, the method comprising:
   etching the stacked film by using a mixed gas of a fluoromethane ($CH_3F$) gas, a nitrogen element-containing gas and a chlorine gas, or a mixed gas of a fluoromethane ($CH_3F$) gas, a nitrogen element-containing gas and a boron trichloride ($BCl_3$) gas,
   wherein the nitrogen element-containing gas is an ammonia ($NH_3$) gas, and
   wherein ammonium bromide or ammonium chloride is formed from the ammonia gas on a bottom surface of a hole or a trench of said first stacked film, or a bottom surface of a hole or a trench of said second stacked film and acts as an etchant of said first stacked film or said second stacked film, respectively.

2. The plasma processing method according to claim 1, wherein
   the etching of the stacked film is related to manufacture of a 3-D NAND flash memory.

3. The plasma processing method according to claim 1, wherein a temperature of the first stacked film and the second stacked film is controlled to be a predetermined temperature at which formation of the ammonium bromide or the ammonium chloride on said bottom surface of the first stacked film or the second stacked film is promoted.

4. The plasma processing method according to claim 3, wherein the predetermined temperature is 20° C. or lower.

* * * * *